US007688289B2

(12) United States Patent
Abe et al.

(10) Patent No.: US 7,688,289 B2
(45) Date of Patent: Mar. 30, 2010

(54) ORGANIC EL DRIVER CIRCUIT AND ORGANIC EL DISPLAY DEVICE

(75) Inventors: Shinichi Abe, Kyoto (JP); Jun Maede, Kyoto (JP); Masanori Fujisawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 852 days.

(21) Appl. No.: 10/594,685

(22) PCT Filed: Mar. 28, 2005

(86) PCT No.: PCT/US2005/005674

§ 371 (c)(1),
(2), (4) Date: Sep. 28, 2006

(87) PCT Pub. No.: WO2005/093702

PCT Pub. Date: Oct. 6, 2005

(65) Prior Publication Data
US 2007/0195017 A1      Aug. 23, 2007

(30) Foreign Application Priority Data
Mar. 29, 2004     (JP)     ............... 2004-095006

(51) Int. Cl.
*G09G 3/30* (2006.01)
(52) U.S. Cl. ............... 345/76; 345/214; 315/169.3
(58) Field of Classification Search ........... 345/76, 345/214; 315/169.3
See application file for complete search history.

(56) References Cited

U.S. PATENT DOCUMENTS 6,777,885 B2 * 8/2004 Koyama ............... 315/169.1

7,145,531 B2 * 12/2006 Jo ............................ 345/76

FOREIGN PATENT DOCUMENTS

| JP | 62-61003 | 3/1987 |
|---|---|---|
| JP | 63-169719 | 7/1988 |
| JP | 2000-276108 | 10/2000 |
| JP | 2002-8858 | 1/2002 |
| JP | 2003-140756 | 5/2003 |
| JP | 2004-78163 | 3/2004 |
| JP | 2004-78210 | 3/2004 |

* cited by examiner

*Primary Examiner*—Amare Mengistu
*Assistant Examiner*—Koosha Sharifi
(74) *Attorney, Agent, or Firm*—Mattingly & Malur, P.C.

(57) ABSTRACT

To provide an organic EL drive circuit including D/A converter circuits capable of reducing the number of elements, which are proof against relatively high voltage, restricting an increase of circuit size and restricting variation of luminance of a display screen and an organic EL display device using the organic EL drive circuit.

An organic EL drive circuit for generating, in response to a predetermined current inputted to an input terminal of a D/A converter circuit constructed with a current mirror circuit, drive currents to be outputted to terminal pins of the organic EL display panel or a current, on which the drive currents are generated, by converting digital display data into analog signal by the D/A converter circuit, comprises a first transistor provided between an input side transistor of the current mirror circuit and the input terminal, a second transistor provided between an output side transistor of the current mirror circuit and an output terminal and a third transistor provided between the output terminal and a power source line, wherein proof voltages of the input side transistor, the output side transistor and the third transistor are lower than proof voltage of the first and second transistors.

12 Claims, 2 Drawing Sheets

ORGANIC EL DRIVER CIRCUIT AND ORGANIC EL DISPLAY DEVICE

TECHNICAL FIELD

This invention relates to an organic EL drive circuit and an organic EL display device using the same organic EL drive circuit and, in particular, the present invention relates to an organic EL drive circuit for charging capacitors of pixel circuits of an active matrix type organic EL display panel, which uses D/A converter circuits capable of reducing the number of elements, which are proof against relatively high voltage, for example, 10V or higher, restricting an increase of circuit size and restricting luminance variation of a display screen of a display device or luminance variation of individual display devices.

BACKGROUND ART

In the prior art liquid crystal display device, a drive circuit having D/A converter circuits for converting digital signals into analog signals to drive data lines has been used. It has been known that, when such drive circuit is housed in an active matrix type organic EL display panel to drive pixel circuits of the display panel, there is a problem that the reduction of size of the organic EL display device is impossible (Patent Reference 1).

Patent Reference 1: JP2000-276108A

DISCLOSURE OF THE INVENTION

Problem to be Solved by the Invention

When the organic EL drive circuit for driving the active matrix type organic EL display panel is provided as an external circuit of the panel, it is possible to reduce the size of organic EL display panel, correspondingly. In such case, the write of drive current value is usually performed by charging capacitor, which is usually several hundreds picofarads, of the pixel circuits with currents, which are usually 0.1 to 10 μA. However, when display luminance of the active matrix type organic EL display panel is tone-controlled, highly precise drive current, minimum current of which is 1 nA to 30 nA, is required. There are two directions of drive current, the sink type and the source type, and a power source voltage +Vcc is in a range from 10V to 20V, presently, regardless of the type of the organic EL display panel.

In the current sink type, the voltage for resetting the capacitor of the pixel circuit is a power source voltage +Vcc or in the vicinity of +Vcc. Therefore, it is necessary to construct the D/A converter circuit with elements, which are proof against relatively high voltage, so that there is a problem that an area taken by these elements becomes large and an area taken by an IC constructed with a plurality of D/A converter circuits provided correspondingly to terminal pins or column pins of the organic EL display panel is increased. When the D/A converter circuit using a current mirror circuit, the pairing characteristics of elements and the matching preciseness between the elements are degraded due to thickness variation of oxide films of the elements, so that it becomes impossible to maintain the preciseness of current conversion high.

As a result, the D/A conversion characteristics is varied. Such variation is reflected to variation of output currents between the terminal pins or the column pins of the organic EL display panel, which is reflected to luminance variation of a display screen of the display device or individual display devices. This is similar for the passive matrix type organic EL display panel.

An object of the present invention is to provide an organic EL drive circuit, which uses D/A converter circuits and is capable of reducing the number of elements, which are proof against relatively high voltage and restricting the increase of circuit size and variation of luminance of a display screen of the display device or individual display devices and an organic EL display device using the same organic EL drive circuit.

Means for Solving the Problem

According to the present invention, an organic EL drive circuit, which, in response to a predetermined current inputted to an input terminal of a D/A converter circuit constructed with a current mirror circuit, generates drive currents to be outputted to terminal pins of the organic EL display panel or a current, on which the drive currents are generated, by converting digital display data into analog signal by the D/A converter circuit, comprises a first transistor provided between an input side transistor of the current mirror circuit and the input terminal, a second transistor provided between an output side transistor of the current mirror circuit and an output terminal and a third transistor provided between the output terminal and a power source line, wherein proof voltages of the input side transistor, the output side transistor and the third transistor are lower than proof voltage of the first and second transistors.

ADVANTAGE OF THE INVENTION

In the present invention, transistors, which are proof against relatively high voltage, for example, 10V or more compared with other transistors of the D/A converter circuit, are provided in the input and output sides of the D/A converter circuit, respectively. Further, a proof voltage of the third transistor, which is a reset switch, is low. Therefore, the number of transistors, which are proof against relatively high voltage is only 2 transistors, which are provided in the input side and the output side of the D/A converter circuit, respectively.

By using a large number of transistors having low proof voltages constituting the D/A converter circuit, it is possible to reduce the area taken by the transistors to thereby reduce the area taken by an IC including a plurality of D/A converter circuits. Further, since it becomes possible to provide a large number of transistors in the IC, it is possible to improve the pairing characteristics of elements and the matching preciseness between the elements. As a result, it is possible to improve preciseness of the D/A conversion to thereby restrict variation of the output currents of the D/A converter circuits.

As such, according to the present invention, the number of transistors having relatively high proof voltages can be reduced. Therefore, it is possible to restrict an increase of circuit size of the organic EL drive circuit, which uses D/A converter circuits as output stage current sources.

BEST MODE FOR CARRYING OUT THE INVENTION

FIG. 1 is a block circuit diagram of an organic EL drive circuit of an active matrix type organic EL display panel according to an embodiment of the present invention and FIG. 2 shows a circuit construction of one of cell circuits thereof.

In FIG. 1, a reference numeral 10 depicts a column driver (data line driver) of the organic EL drive circuit, 11 a D/A converter circuit thereof, 12 a constant current source for generating a reference drive current Ir, 13 and 14 constant voltage bias circuits, respectively, 15 a control circuit, 16 a register for storing display data and 17 an MPU.

The D/A converter circuit 11 is constructed with a current mirror circuit having an input side transistor cell circuit TNa and output side transistor cell circuits TNb to TNn.

Each of the transistor cell circuits TNa to TNn is constructed with a transistor cell circuit 1 including N channel transistors T1 to T3 connected in series between a power source line and a ground line (reference potential line) as shown in FIG. 2. The transistor T1 has a drain terminal D, a gate terminal G1, the transistor T2 has a gate G2 and the transistor T3 has an input terminal Din and a source terminal S. The transistor T3 constitutes a switch circuit.

The source terminal S of each cell circuit 1 is grounded. The input terminal Din of the transistor cell circuit TNa is connected to a bias line Va and is normally ON. Display data D0 to Dn−1 from the display register 16 are inputted to the input terminals Din of the transistor cell circuits TNb to TNn, which correspond to the input terminal Din of the transistor T3 shown in FIG. 2, respectively. Switch circuits SW (transistors T3) of the transistor cell circuits TNb to TNn are ON/OFF controlled by the display data D0 to Dn−1. The display data D0 to Dn−1 are set in the register 16 from the MPU 17 according to the latch pulse LP of the control circuit 15.

The gate terminals G1 and G2 of the transistor cell circuits TNa to TNn are connected commonly. Further, the gate terminal G2 of the cell circuit 1 corresponding to the transistor cell circuit TNa is connected to an input terminal 11a of the D/A converter circuit 11. The drain terminal D of the cell circuit 1 corresponding to the transistor cell circuit TNa is connected to the input terminal 11a of the D/A converter circuit 11 through a source-drain of an N channel transistor Q1 having relatively high proof voltage higher than 10V. Therefore, the transistor T2 of the cell circuit 1 corresponding to the transistor cell circuit TNa is diode-connected and becomes the input side transistor of the current mirror circuit. Thus, the drive current Ir from the constant current source 12 is supplied to the transistor cell circuit TNa.

The constant current source 12 is connected to a bias line Vb and corresponds to an output current source of a reference current distribution circuit. A reference current is supplied to an input side transistor of a current mirror circuit constituting the reference current distribution circuit and the reference current distribution circuit generates the reference currents from a number of output side transistors provided in parallel correspondingly to the output terminal pins of the column driver 10 as mirror currents and distributes the mirror currents to the column pins (output terminal pins) of the organic EL display panel.

The drains D of the respective transistor cell circuits TNb to TNn are connected to an output terminal 11b of the D/A converter circuit 11 through a source-drain of an N channel transistor Q2 having relatively high proof voltage. The output terminal 11b is connected to an output pin 10a and a reset switch circuit 2 is provided between the output pin 10a and the power source line +Vcc. The reset switch circuit 2 is constructed with a P channel transistor TPa having a source connected to the power source line +Vcc and a drain connected to the output pin 10a. Voltage of the power source line +Vcc is in a range from 10V to 20V.

A reset signal RS from the control circuit 15 is supplied to a gate of the transistor TPa. The commonly connected gate terminals G1 of the transistor cell circuits TNa to TNn are connected to the constant voltage bias circuit 13. The transistors T1 on the upstream side of the cell circuits 1 of the transistors are set to ON state by a gate voltage VGL set in the constant voltage bias circuit 13 and the sources of the transistors T1 is set to a voltage lower than the constant voltage generated by the constant voltage bias circuit 13 by about 0.7V.

The gates of the transistors Q1 and Q2, which are connected commonly, are connected to the constant voltage bias circuit 14. The transistors Q1 and Q2 are set to ON state by a gate voltage VGH set by the constant voltage bias circuit 14 and the sources of the transistors Q1 and Q2 are set to a voltage lower than the constant voltage generated by the constant voltage bias circuit 14 by about 0.7V.

By arranging the transistors Q1 and Q2 on the input side and the output side of the current mirror circuit in this manner to generate relatively large drop voltage, it is possible to lower the operating voltage of the transistor TPa and the transistor cell circuits TNa to TNn.

Further, since the gates of the transistors Q1 and Q2 are connected to the constant voltage bias circuit 14, it is possible to equalize the voltages of the drain terminals D of the transistor cell circuits TNa to TNn. Therefore, it is possible to reduce the area taken by the D/A converter circuits in the column driver 10 and to improve preciseness of the D/A conversion.

As a result, the variation of conversion characteristics of the D/A converter circuit is reduced, so that the variation of output currents between the column pins or terminal pins of the organic EL display panel and variation of luminance of the display screen of the display, device or the variation of luminance of individual display devices can be restricted.

Signs ×1, ×2, ×4, . . . shown in the vicinity of the respective transistor cell circuits depict the number of cell circuits 1 connected in parallel. In the case of ×1, there is no parallel connection. According to the number ×n of cell circuits, the outputs of the output side transistor cell circuits TNb to TNn are weighted, respectively.

The cell circuit 1 constituting each of the transistor cell circuits TNa to TNn of the D/A converter circuit 11 is constituted with series-connected three N channel transistors Tr1 to Tr3 whose sources and drains are connected in series between a power source line and a ground line GND as shown in FIG. 2. The transistor Tr3 constitutes a switch circuit and has a source connected to the source terminal S. The drain of the transistor Tr1 is connected to a drain terminal D.

The gate of the transistor Tr2 is connected to the gate terminal G1 and the gate of the transistor Tr3 is connected to the gate terminal G2.

Incidentally, the back gates of the transistors Tr1 to Tr3 are connected to the source terminal S commonly.

Returning to FIG. 1, a pixel circuit (display cell) 3 is provided for each of display pixels of the organic EL display panel and connected to the output pin 10a through a data line X and a connection terminal 3a. The pixel circuit 3 is provided for each of cross points of X and Y matrix wirings (data line X and scan lines Y1, Y2, . . . ). The pixel circuit 3 includes P channel MOS transistors TP1 and TP2 having gates connected to the scan lines Y and drains connected to the data line X. An OEL element 4 is driven by P channel MOS drive transistors TP3 and TP4 provided in the pixel circuit 3. A capacitor C is provided between a source and a gate of the transistor TP3.

A source of the transistor TP1 is connected to the gate of the transistor TP3 and a source of the transistor TP2 is connected to a drain of the transistor TP3. Therefore, when the transistors TP1 and TP2 are turned ON, the gate and the drain of the transistor TP3 are diode-connected to flow the drive current into the transistor TP3 and a voltage value corresponding to the drive current is stored in the capacitor C with high precision.

The source of the transistor TP3 is connected to the power source line +Vcc and the drain thereof is connected to an anode of the OEL element 4 through the source-drain of the transistor TP4. A cathode of the OEL element 4 is grounded through a switch circuit 7a of a row side scan circuit 7.

The gates of the transistors TP1 and TP2 are connected to the write control circuit 5 through the scan line (write line) Y1 and scanned by the write control circuit 5. When the scan line Y1 becomes LOW ("L") level, the transistors TP1 and TP2 are tuned ON. After the resetting is ended by the reset signal RS as mentioned after, a predetermined drive current, which is sunk by the D/A converter circuit 11, flows from the power source line +Vcc through the transistor TP3, the capacitor C, the transistors TP1 and TP2, the data line X, the terminal 3a and the output pin 10a, so that the voltage corresponding to the drive current is written and stored in the capacitor C. And, the scan line Y1 becomes HIGH ("H") level, so that the transistors TP1 and TP2 are turned OFF.

The gate of the transistor TP4 is connected to the write control circuit 5 through the scan line Y2. The transistor TP4 is scanned by the write control circuit 5 and, when the scan line (drive line) Y2 becomes "L", the transistor TP4 is turned ON. Therefore, the transistors TP3 and TP4 are kept ON, so that the drive current is supplied to the OEL element 4. Incidentally, in this case, the transistors TP1 and TP2 are in OFF state since the scan line Y2 is in "H" level.

At the time when the driving of the transistors TP3 and TP4 is ended, the row side is shifted to a next scan line Y2 and the scan line Y2 becomes "H". Therefore, the transistor TP4 is turned OFF. The scan line Y1 becomes "L" and the voltage of the capacitor C is reset by the transistors TP1 and TP2, which are turned ON with this timing, and the transistor TPa, which is turned ON by the reset signal RS.

After this resetting is ended, the predetermined drive current, which is sunk by the D/A converter circuit 11, flows and written in the capacitor C.

Incidentally, the resetting by the reset signal RS and the writing in the capacitor C are performed during a reset period corresponding to the retrace period of horizontal scan.

Though not shown in the drawings, the switch circuit SW (transistor Tr3) of the cell 1 of the transistor cell circuit TNa can be turned OFF by making the input terminal Din of the transistor circuit TNa "L" according to the reset signal RS in the reset period within which the voltage of the capacitor C is reset. By turning the switch circuit SW OFF, the transistor cell circuits TNb to TNn are turned OFF. Therefore, when the transistor TPa is turned ON by the reset signal RS, it is possible to block currents of the transistor cell circuits TNa to TNn of the D/A converter circuit 11 to thereby reduce power consumption.

INDUSTRIAL APPLICABILITY

Though, in the described embodiment, the D/A converter circuit is used as the output stage current source, it is possible, by further providing output stage current sources constructed with current mirror circuits, to current-drive the output stage current sources. In such case, the transistor TPa (the third transistor) as the reset switch may be one of the transistors constructing the output stage current sources or another of the transistors.

Incidentally, by providing such output stage current sources, the organic EL drive circuit of the present invention becomes suitable to use in a drive circuit of a passive matrix type organic EL display panel, though the active matrix type organic EL display panel is described.

Further, though the D/A converter is constructed with mainly the N channel MOS transistors in this embodiment, it is, of course, possible to construct the D/A converter with P channel MOS transistors or a combination of N channel MOS transistors and P channel MOS transistors.

Though, in the described embodiment, the MOS transistors are used, it is, of course, possible to use bipolar transistors instead of the MOS transistors. In such case, the gate, the source and the drain of the MOS transistor correspond to a base, an emitter and a collector of the bipolar transistor, respectively.

DESCRIPTION OF REFERENCE NUMERALS AND SIGNS

Figure 1:
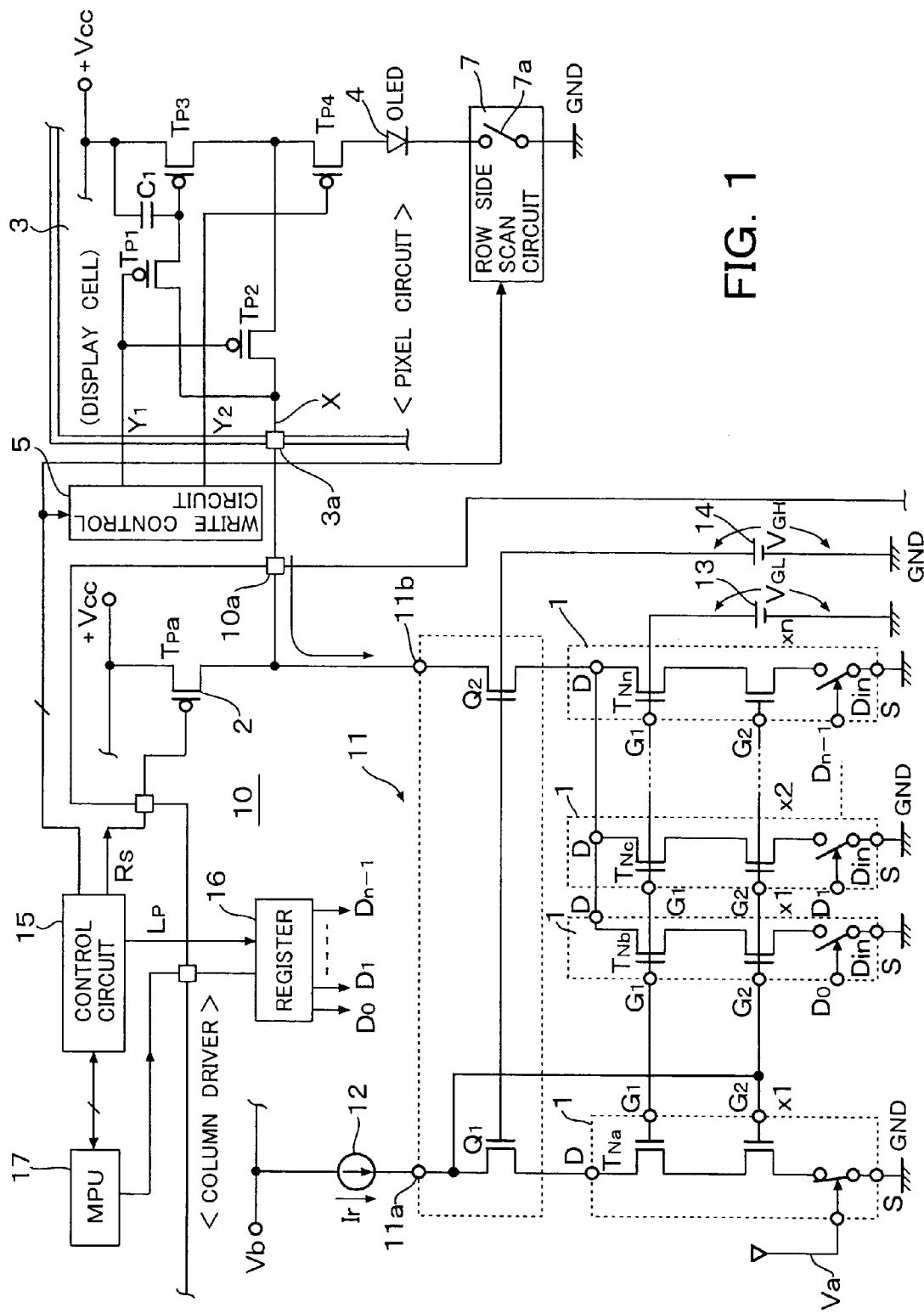
FIG. 1 is a block circuit diagram of an organic EL drive circuit of an active matrix type organic EL display panel, according to an embodiment of the present invention.
Figure 2:
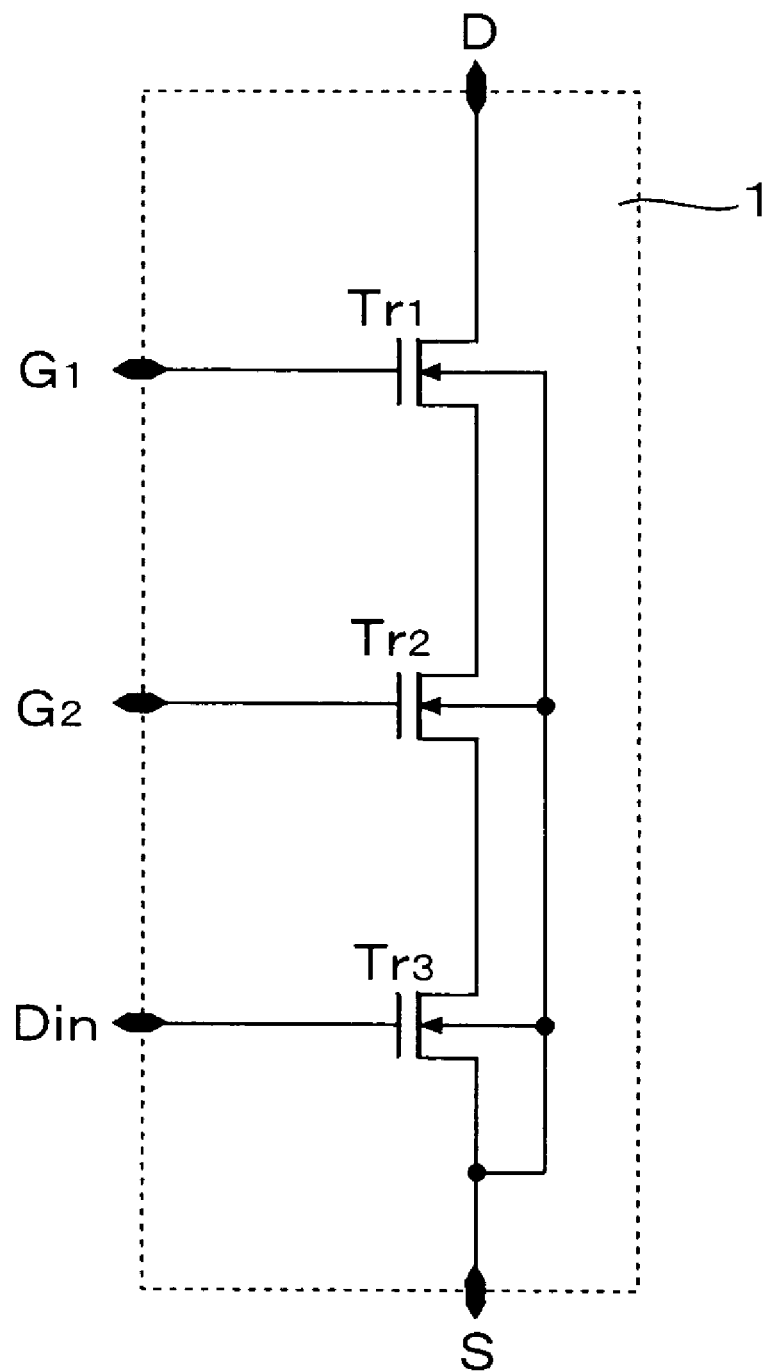
FIG. 2 is a circuit construction of a cell circuit thereof.

1 . . . transistor cell circuit
2 . . . reset switch circuit
3 . . . pixel circuit (display cell)
4 . . . organic EL element (OEL element)
5 . . . write control circuit
7 . . . row side scan circuit
7a . . . switch circuit
10 . . . column driver
10a . . . output pin
11 . . . D/A converter
12 . . . constant current source
13, 14 . . . constant voltage bias circuit
15 . . . control circuit
16 . . . register
17 . . . MPU
Q1 to Q3 . . . MOS transistor
Trr1 to Tr7 . . . MOS transistor
TNa to TNn . . . MOS transistor

The invention claimed is:

1. An organic EL drive circuit for generating, in response to a predetermined current inputted to an input terminal of a D/A converter circuit constructed with a current mirror circuit, drive currents to be outputted to terminal pins of the organic EL display panel or a current, on which the drive currents are generated, by converting digital display data into analog signal by the D/A converter circuit, comprising:

first transistor provided between an input side transistor of the current mirror circuit and the input terminal:
a second transistor provided between an output side transistor of the current mirror circuit and an output terminal; and
a third transistor provided between the output terminal and a power source line, wherein proof voltages of the input side transistor, the output side transistor and the third transistor are lower than proof voltage of the first and second transistors and;
wherein the first transistor and the second transistor are biased such that a connecting point of the input side transistor and the first transistor and a connecting point of the output side transistor and the second transistor become substantially equal potentials.

2. An organic EL drive circuit as claimed in claim 1, wherein the connecting points become substantially equal potentials by setting gates or bases of the first transistor and the second transistor to predetermined constant voltages.

3. An organic EL drive circuit as claimed in claim 2, wherein the first and second transistors are proof against relatively high voltage corresponding to a power source voltage of 10V or more.

4. An organic EL drive circuit as claimed in claim 3, wherein the third transistor is a reset switch.

5. An organic EL drive circuit as claimed in claim 3, wherein the third transistor is one of transistors, which construct an output stage current source for generating the drive current.

6. An organic EL drive circuit as claimed in claim 2, wherein the output terminal is an output terminal of the D/A converter, each of the input side transistor and the output transistor is constructed with a plurality of series-connected transistors between a power source line and a reference potential line and a plurality of the output side transistors are provided in parallel to the input side transistor and are connected to the output terminal, respectively.

7. An organic EL drive circuit as claimed in claim 3, wherein each of the input side transistor and the output side transistor includes a transistor connected in series and constructing a switch circuit and is formed as a cell circuit, the transistor constructing the switch circuit of the input side transistor is set to ON state and the transistor constructing the switch circuit of each of the output side transistors is ON/OFF controlled by the display data.

8. An organic EL drive circuit as claimed in claim 7, wherein the organic EL display panel includes a plurality of the terminal pins and the D/A converter circuits are provided correspondingly to the plurality of the terminal pins, respectively.

9. An organic EL drive circuit as claimed in claim 8, wherein the input side transistor of the current mirror circuit of each of the D/A converter circuits responds to the reference current or a reference drive current generated according to the reference current, which is distributed to each of the terminal pins.

10. An organic EL drive circuit as claimed in claim 9, wherein the output terminals are connected to data line of an active matrix type organic EL display panel.

11. An organic EL drive circuit as claimed in claim 5, wherein the output terminal is an output terminal of the output stage current source and connected to column lines of a passive matrix type organic EL display panel.

12. An organic EL display device comprising an organic EL drive circuit claimed in claim 1.

* * * * *